United States Patent
Yang et al.

(10) Patent No.: US 6,372,651 B1
(45) Date of Patent: *Apr. 16, 2002

(54) METHOD FOR TRIMMING A PHOTORESIST PATTERN LINE FOR MEMORY GATE ETCHING

(75) Inventors: Wenge Yang, Fremont; Lewis Shen, Cupertino, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,464

(22) Filed: Apr. 6, 1999

Related U.S. Application Data

(62) Division of application No. 09/118,374, filed on Jul. 17, 1998.

(51) Int. Cl.⁷ .......................................... H01L 21/3065
(52) U.S. Cl. .................. 438/706; 438/710; 438/712; 438/713
(58) Field of Search .................. 438/706, 712, 438/710, 717, 718, 720, 724, 725, 257, 244; 257/510, 513

(56) References Cited

U.S. PATENT DOCUMENTS

| | | | | |
|---|---|---|---|---|
| 4,784,719 A | * | 11/1988 | Schutz | 156/643 |
| 5,308,742 A | * | 5/1994 | Ta | 430/313 |
| 5,679,591 A | | 10/1997 | Lin et al. | |
| 5,710,067 A | * | 1/1998 | Foote et al. | 438/723 |
| 5,751,039 A | | 5/1998 | Kauffman et al. | |
| 5,773,199 A | * | 6/1998 | Linliu et al. | 430/316 |
| 5,801,399 A | | 9/1998 | Hattori et al. | |
| 5,831,321 A | * | 11/1998 | Nagayama | 257/412 |
| 5,837,428 A | * | 11/1998 | Huang et al. | 430/313 |
| 5,851,927 A | * | 12/1998 | Cox et al. | 438/744 |
| 5,886,391 A | * | 3/1999 | Nirooman et al. | 257/510 |
| 6,010,829 A | * | 1/2000 | Rogers et al. | 430/316 |
| 6,027,959 A | * | 2/2000 | En et al. | 438/142 |
| 6,194,748 B1 | * | 2/2001 | Parat et al. | 257/774 |

* cited by examiner

Primary Examiner—Robert Kunemund
Assistant Examiner—Lan Vinh

(57) ABSTRACT

Memory gate stacks having widths of about 0.18 microns to 0.15 microns are formed by trimming a resist mask pattern, having line widths of about 0.25 microns, to a width of about 0.20 microns. An antireflective coating layer such as silicon oxynitride underlying the resist pattern is then etched to form etched silicon oxynitride pattern lines having widths of about 0.18 to 0.15 microns. The etched silicon oxynitride layer is then used for self-aligned etching of underlying layers to form the memory gate stack. Hence, a memory gate can be formed that has a width substantially less than the current photolithography limit during formation of the resist mask pattern.

5 Claims, 3 Drawing Sheets

METHOD FOR TRIMMING A PHOTORESIST PATTERN LINE FOR MEMORY GATE ETCHING

This application is a divisional of application Ser. No. 09/118,374 filed Jul. 17, 1998.

BACKGROUND OF THE INVENTION

1. Technical Field

The present invention relates to semiconductor devices and manufacturing processes, and more particularly to methods and arrangements associated with a multipurpose graded silicon oxynitride cap layer in non-volatile memory semiconductor devices.

2. Background Art

A continuing trend in semiconductor technology is to build integrated circuits with more and/or faster semiconductor devices. The drive toward this ultra large-scale integration (ULSI) has resulted in continued shrinking of devices and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array is reduced by a omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source drain, floating gate, and control gate to which various voltages are applied to program the cell with a binary 1 or 0. Each memory cell can be read by addressing it via the appropriate word and bit lines.

An exemplary memory cell 8 is depicted in FIG. 1A, viewed in a cross-section through the bit line. Memory cell 8 includes a doped substrate 12 having a top surface 11, and a source 13A and a drain 13B formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13A. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13B.

FIG. 1B depicts a cross-section of several adjacent memory cells from the perspective of a cross-section through the word line (i.e., from perspective A, as referenced in FIG. 1A). In FIG. 1B, the cross-section reveals that individual memory cells are separated by isolating regions of silicon dioxide formed on substrate 12. For example, FIG. 1B shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a and 14b. Interpoly dielectric layer 24 has been conformally deposited over the exposed portions of floating gates 16a, 16b, and 16c and field oxides 14a and 14b. Interpoly dielectric layer 24 isolates floating gates 16a, 16b and 16c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the basic features depicted in the memory cells of FIGS. 1A and 1B, placed a burden on the fabrication process to deposit and subsequently pattern a layer stack to form a floating gate/control gate structure, without creating deleterious effects within the resulting memory cells. In particular, conventional photolithography techniques using deep ultraviolet (DUV) lithography techniques has a limit on the order of about 0.25 microns resist line widths. Hence, the size of the memory gate generally has been limited to the capabilities of the DUV photolithography techniques.

One technique commonly used in logic processes used to form logic circuits is trimming the resist pattern. Specifically, the technique is used for logic processes, where the resist pattern is etched to trim the resist pattern, causing a reduction in the resist line width of up to 0.1 microns. However, the resist cannot be trimmed any more than 0.1 microns due to the accumulation of polymers during the etching along the edges of the trim. Hence, a logic mask can be trimmed by up to 0.1 microns, for example reduced from a width of 0.28 microns to 0.18 microns.

The resist trim process in the logic processes, however, is not practicable in etching of memory gates, since the number of layers etched in logic processes is substantially less than in memory gate etching. Logic processes require a resist thickness of about 2,000 Angstroms, whereas the thickness required for etching the plurality of layers used to form a memory gate is about 8,000–9,000 Angstroms. In addition, there is a concern in memory processes of resolution in both line and space, as opposed to logic processes. Moreover, there is a concern of accumulation of the polymers during etching. Hence, etching of the resist mask may result in loss of the mask pattern during memory gate etching.

SUMMARY OF THE INVENTION

There is a need for an arrangement that enables memory gate sizes to be reduced in a manner that overcomes the existing limits of conventional DUV lithography techniques.

There is also a need for an arrangement that enables a resist mask pattern to be trimmed, while enabling the mask pattern to be preserved for memory gate etching.

These and other needs are attained by the present invention, where a resist mask pattern is formed overlying on an antireflective coating layer formed on a semiconductor wafer having a plurality of layers. The sidewalls of the resist mask pattern lines are first etched to a first prescribed reduced width, and then the antireflective coating layer is etched based on the etched resist mask pattern lines. The etching of the antireflective coating layer forms etched antireflective coating layer pattern lines that have a width less than the width of the etched sidewalls of the resist mask pattern lines.

According to one aspect of the present invention, a method of etching a semiconductor wafer having a plurality of layers to form a memory gate stack comprises forming a resist mask pattern, having pattern lines, overlying on an antireflective coating layer formed on the semiconductor wafer, first etching sidewalls of the resist mask pattern lines to a first prescribed reduced width, second etching the antireflective coating layer, based on the etched resist mask pattern lines, to form etched antireflective coating layer pattern lines having a second prescribed reduced width less than the first reduced width, and third etching the plurality of layers underlying the antireflective coating layer based on the etched antireflective coating layer pattern lines. Etching of the antireflective coating layer enables the resist mask pattern lines having the first prescribed reduced width to be transferred to the antireflective coating layer. In addition, the second etching enables further width reduction of the pattern lines, enabling the plurality of layers underlying the antireflective coating layer to be etched based on the etched antireflective coating layer pattern. Hence, a memory gate can be formed that has a width substantially less than the current photolithography limit during formation of the resist mask pattern.

Another aspect of the present invention provides a method of etching a semiconductor wafer, having a plurality of layers and an antireflective coating layer overlying on the plurality of layers, using a resist mask pattern formed on the antireflective coating layer and having a minimum resist line width of about 0.25 microns comprising etching the resist mask pattern to a maximum etched resist line width of about 0.20 microns, and etching the antireflective coating layer based on the etched resist mask pattern to form an etched antireflective coating layer having maximum line widths of about 0.18 microns, wherein the etched antireflective coating layer is used to etch the plurality of layers to form a memory gate stack. The etching of the antireflective coating layer enables further reduction in the resist mask pattern by removing polymers that normally accumulate during the etching of the resist mask pattern. Moreover, the etching of the antireflective coating layer based on the etched resist mask pattern enables formation of line widths less than or equal to 0.18 microns using 0.25 micron lithography technology, where the plurality of layers underlying the etched antireflective coating layer can be etched to form memory gate structures having widths of about 0.18 microns or less.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1A:
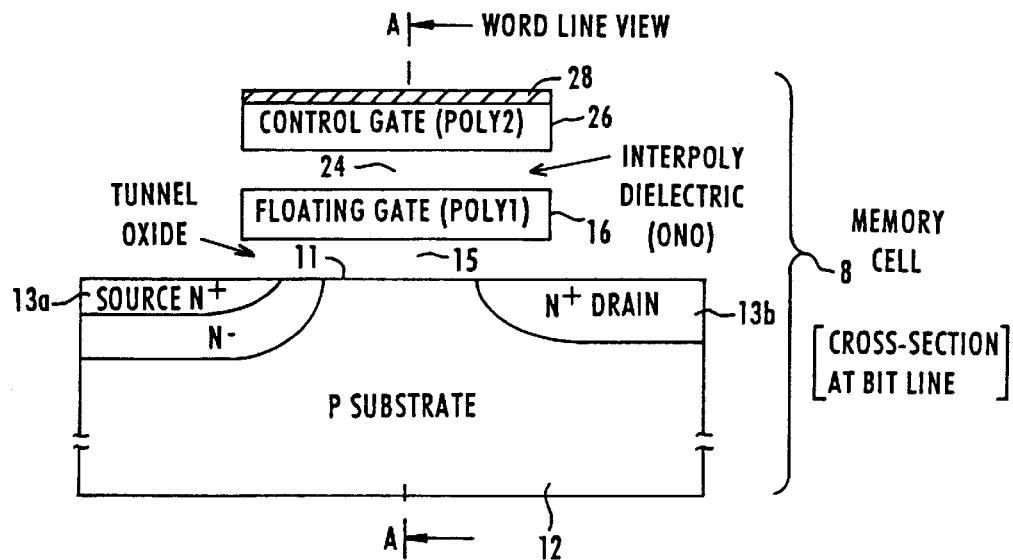
FIGS. 1A and 1B are diagrams illustrating cross-sectional views of a portion of a conventional semiconductor device memory cell along bit-line and word-line views, respectively.
Figure 1B:
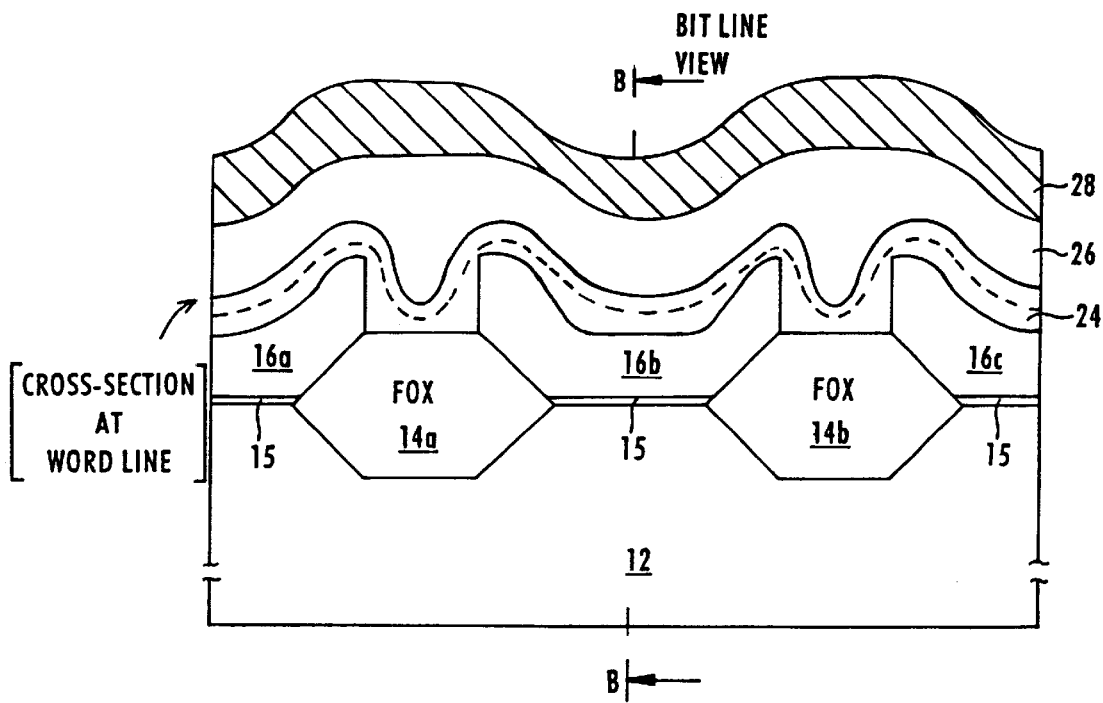
Figure 2A:
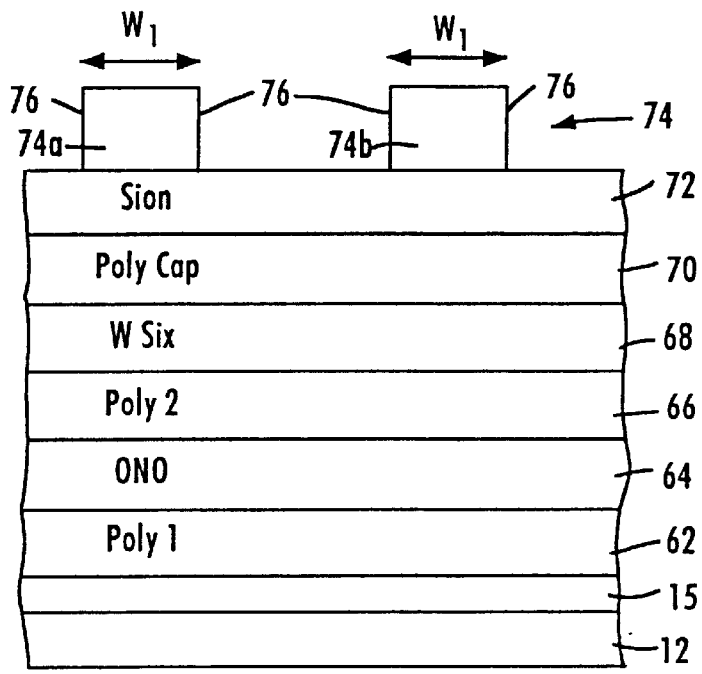
FIGS. 2A, 2B, 2C and 2D are diagrams summarizing the method for etching a semiconductor wafer having a plurality of layers to form a memory gate stack according to an embodiment of the present invention.
Figure 2B:
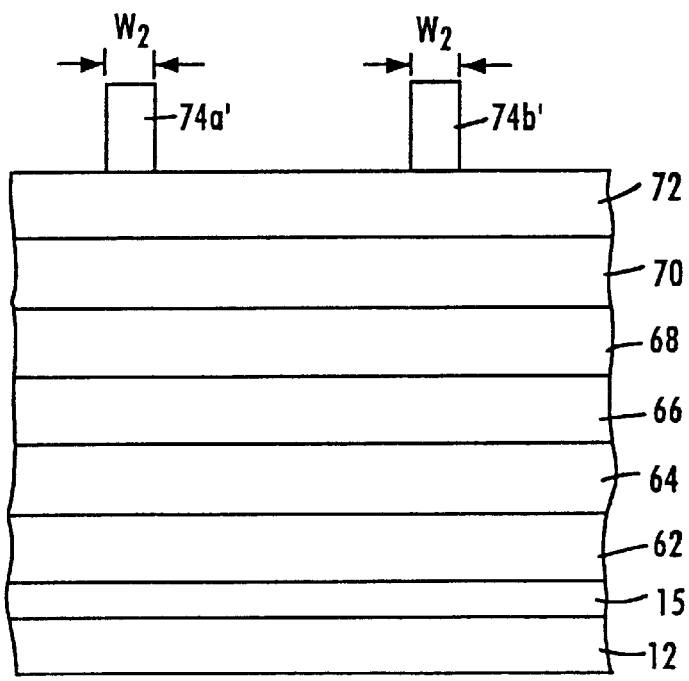
Figure 2C:
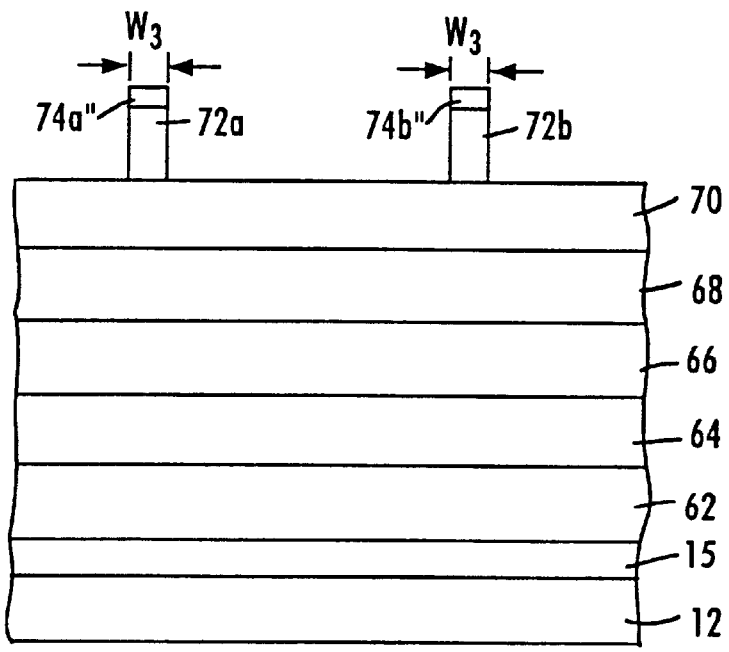
Figure 2D:
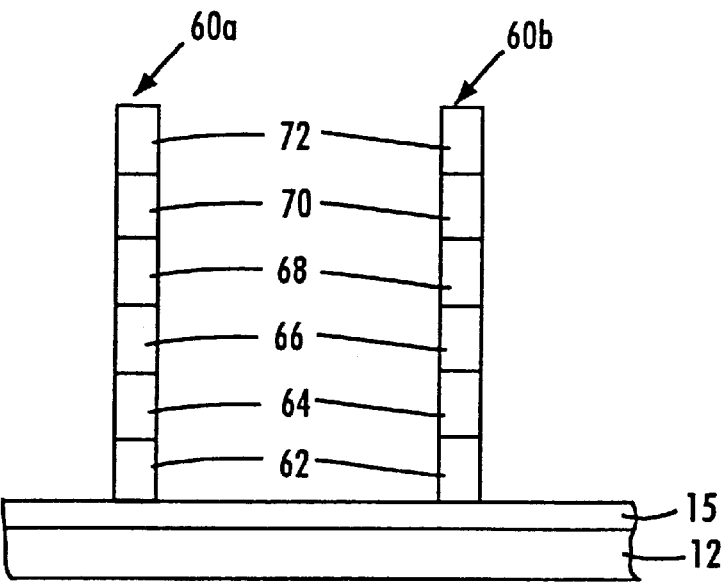

According to the disclosed embodiment, a memory gate stack 60, shown in FIG. 2D, is formed using a double-trim process, where the sidewalls of the resist mask pattern lines are first etched to a first reduced width, followed by etching the antireflective coating layer 72, based on the etched resist mask pattern lines, to form etched antireflective coating layer pattern lines that have a further reduced width, and which are used to etch the plurality of layers underneath the antireflective coating layer.

The layers 60 include a tunnel oxide layer 15 overlying on the silicon substrate 12, a first polysilicon layer 62 overlying on the tunnel oxide layer 15, and an oxide-nitride-oxide (ONO) layer 64 overlying on the first polysilicon layer 62. The stack 60 also includes a second polysilicon layer 66 overlying on the ONO layer 64, a silicide (WSi$_x$) layer overlying on the second polysilicon layer 66, a polysilicon cap layer 70 overlying on the silicide layer 68, and a silicon oxynitride (SiON) layer 72 overlying on the polysilicon cap layer 70. The silicon oxynitride layer 72 serves as an antireflective coding (ARC) layer, and hence may be used for many reduced-size critical dimension semiconductor devices. Both the polysilicon cap layer 70 and the silicon oxynitride layer 72 are deposited using conventional chemical vapor deposition (CVD) or plasma enhanced chemical vapor deposition (PECVD) techniques. The polysilicon cap layer 70 typically includes undoped polysilicon and has a thickness of about 500 Angstroms. The silicon oxynitride layer includes silicon oxynitride (e.g., SiO$_x$, N$_y$ (wherein x and y represent the atomic percentage of oxygen and nitrogen, respectively) and has a thickness of about 400 Angstroms.

The layer stack 60 is configured for submicron memory gates, and has a height of between about 3,500 Angstroms to about 5,000 Angstroms. The tunnel oxide layer 15 is about 50 Angstroms thick, and is thermally grown on substrate 12. The polysilicon layer 62 is a doped polysilicon layer formed on the tunnel oxide 15 using conventional CVD or PECVD techniques to a thickness of about 900 to about 1,100 Angstroms, and is used in the memory gate as the floating polysilicon gate. The interpoly dielectric layer (ONO) 64 is then formed overlying on the polysilicon layer 62 using conventional deposition techniques to a thickness of about 150 to 200 Angstroms total. As recognized in the art, the ONO layer 64 may be formed by a three-stage process including forming a first film of silicon dioxide on the polysilicon layer 62, depositing a film of silicon nitride on the silicon dioxide, and then depositing a second film of silicon dioxide on the silicon nitride film.

The polysilicon layer 66 is then deposited on the ONO layer 64 to a thickness of about 1,200 Angstroms. The silicide layer 68 is then formed using conventional silicide forming techniques to a thickness of about 1,100 to 1,700 Angstroms. The poly cap layer 70 is then formed to a thickness of about 500 Angstroms.

The silicon oxynitride layer is then deposited overlying on the poly cap layer 70. Although the preferred embodiment uses silicon oxynitride as the antireflective coating layer 72, alternative cap layer materials may be used that include a controllable atomic percentage of nitrogen, for example, silicon oxime.

As shown in FIG. 2A, the method begins by forming a resist mask pattern 74, having pattern lines 74a and 74b, overlying on an antireflective coating layer 72 on the semiconductor wafer. The resist mask pattern lines 74a and 74b each have a width ($W_1$) of about 0.25 microns, which corresponds to the limit of conventional deep ultraviolet (DUV) lithography techniques. As recognized in the art, the resist layer 74 has a thickness of about 9,700 Angstroms. The sidewalls 76 of the resist mask pattern lines 74a and 74b are then etched to a prescribed reduced width ($W_2$), equal to a maximum of about 0.20 microns, in a poly etch chamber in an environment including HBr and $O_2$. As recognized in the art, the etching of the sidewalls 76 (i.e., trimming) of the resist mask pattern lines 74a and 74b is performed within a linear etch region with respect to time, minimizing the accumulation of polymers along the etched resist mask pattern lines 74a' and 74b' (shown in FIG. 2B).

Following etching of the resist mask pattern lines resulting in the resist pattern lines 74a' and 74b' having the reduced width ($W_2$) of about 0.20 microns, the antireflective coating layer 72 is etched in a plasma etch chamber having an environment containing $CHF_3$, $CF_4$, $O_2$, and Ar having percentages of 10, 20, 10, and 50, respectively. The antireflective (SiON) layer 72 is etched based on the etched resist mask pattern lines 74a' and 74b', to form the etched antireflective coating layer pattern lines 72a and 72b, shown in FIG. 2C.

As shown in FIG. 2C, the SiON etch procedure further reduces the width of the resist mask pattern lines 74a" and 74b" by removal of the accumulated polymers. Specifically, the polymers accumulated on the resist pattern are cleaned by the carbon hexafluoride ($CF_4$) gas, enabling further trimming of the resist lines 74". Hence, the width ($W_3$) of the resist lines 74 and the SiON lines 72 have a width of about 0.18 microns to 0.15 microns. Hence, the etching of the antireflective coating layer 72 results in the etched antireflective coating layer pattern lines 72a and 72b having a maximum width of about 0.18 microns. The layers 70, 68, 66, 64, and 62 are then successively etched using the etched antireflective coating layer pattern lines 72a and 72b as an etch mask, resulting in the memory gate stacks 60a and 60b having widths of about 0.18 microns to 0.15 microns, as shown in FIG. 2D. Although the thickness of the etched resist lines 74" is about 4,000 Angstroms and hence insufficient to complete etching to form the stack, the formation of the pattern lines 72a and 72b in the SiON layer 72 enables self-aligned etching of the memory gate stack 60 based on the SiON pattern lines 72a and 72b.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of etching a semiconductor wafer having a plurality of layers to form a memory gate stack, the method comprising:

forming a resist mask pattern containing pattern lines having a minimum resist line width of about 0.25 microns, overlying on an antireflective coating layer formed on the semiconductor wafer;

first etching sidewalls of the resist mask pattern lines to a first prescribed reduced width of about 0.20 microns or less, without etching the antireflective coating layer;

second etching the antireflective coating layer, based on the etched resist mask pattern lines, to form etched antireflective coating layer pattern lines having a second prescribed reduced width less than or equal to about 0.18 microns, and smaller than achievable by conventional deep ultraviolet photoexposure techniques; and third etching the plurality of layers underlying the antireflective coating layer based on the etched antireflective coating layer pattern lines.

2. The method of claim 1, wherein the plurality of layers includes a first polysilicon layer overlying a silicon substrate, a oxide-nitride-oxide layer overlying on the first polysilicon layer, a second polysilicon layer overlying on the oxide-nitride-oxide layer, a silicide layer overlying on the second polysilicon layer, and a polysilicon cap layer overlying on the silicide layer.

3. The method of claim 1, wherein the step of etching the antireflective coating layer further includes cleaning reactants having accumulated on the etched resist mask pattern.

4. The method of claim 1, wherein the antireflective coating layer is silicon oxynitride, the second step including etching the silicon oxynitride in a plasma etch chamber having an environment containing $CHF_3$, $CF_4$, $O_2$, and Ar.

5. The method of claim 4, wherein the first step includes etching the sidewalls in a polysilicon etch chamber having an environment containing HBr and $O_2$.

* * * * *